United States Patent [19]

Wilkinson

[11] Patent Number: 5,473,443
[45] Date of Patent: Dec. 5, 1995

[54] VIDEO MEMORY

[75] Inventor: James H. Wilkinson, Tadley, United Kingdom

[73] Assignee: Sony United Kingdom Limited, Staines

[21] Appl. No.: 67,036

[22] Filed: May 26, 1993

[30] Foreign Application Priority Data

Jul. 3, 1992 [GB] United Kingdom .............. 9214235

[51] Int. Cl.[6] .................................. H04N 5/76
[52] U.S. Cl. .................. 358/336; 358/335; 360/10.1
[58] Field of Search ................... 360/32, 10.1, 27, 360/19.1, 14.3, 38.1; 358/335, 341, 343, 312, 339, 319, 323, 340, 337, 336; 348/61, 462, 463, 464, 465, 467, 468, 466, 521

[56] References Cited

U.S. PATENT DOCUMENTS

| | | | |
|---|---|---|---|
| 4,099,258 | 7/1978 | Parsons | 348/468 |
| 4,698,698 | 10/1987 | Collins | 360/10.1 |
| 4,931,870 | 6/1990 | den Hollander | 348/463 |
| 5,043,830 | 8/1991 | Nobuhiro | 358/341 |
| 5,060,077 | 10/1991 | Koya et al. | 358/335 |
| 5,179,451 | 1/1993 | Takeshita et al. | 358/335 |

Primary Examiner—Howard W. Britton
Assistant Examiner—Huy Nguyen
Attorney, Agent, or Firm—William S. Frommer; Alvin Sinderbrand

[57] ABSTRACT

A video memory comprises a video store for storing video data comprising a plurality of input video data blocks, each input video data block comprising a plurality of pixel data words and one or more ancillary data words associated with that input video data block. The video memory allows the stored pixel data words to be read out, along with their associated ancillary data word(s), in a transposed order and comprises means for reading the ancillary data words associated with a predetermined sequence of input video data blocks into a recirculating output buffer, and serial reading means for reading successive output video data blocks from the video store, each output video data block comprising pixel data words from the predetermined sequence of the input video data blocks, the serial reading means and the recirculating output buffer being operable to output concurrently each pixel data word in each output video data block with its associated ancillary data word(s).

9 Claims, 6 Drawing Sheets

VIDEO MEMORY

BACKGROUND OF THE INVENTION

1. Field of the Invention

This invention relates to video memories.

2. Description of the Prior Art

A digital video tape recorder (DVTR) uses a video memory to store video data replayed from a digital video tape.

In a previously proposed DVTR, replayed video data comprising a succession of so-called 'inner' data blocks are first subjected to an initial 'inner' stage of error correction. Inner error correction is performed on individual inner data blocks to correct replay errors of up to a certain severity and to detect (but not to correct) more severe replay errors. Any replay errors in an inner data block which are detected but uncorrected by the inner error corrector are signified by an error flag output by the inner error corrector and associated with that inner data block.

The output from the inner error corrector, i.e. the inner data blocks with their associated error flags and other ancillary data such as a video field identifier, are then stored in a video memory or field store. The contents of the video memory are then read out in a transposed order as 'outer' data blocks comprising individual pixel data words from a predetermined sequence of inner data blocks, for a further stage of error correction by an 'outer' error corrector. In order that the data in the video memory can be read out in a different order to that in which they were stored, the error flag and other ancillary data associated with each inner data block are stored with each individual pixel data word in that inner data block. For example, if the pixel data words in the inner data blocks each comprise 8 bits and there are 4 bits of ancillary data associated with each inner data block, then the above arrangement will mean that the video memory has to store 12-bit data words so that each data word contains the video data and the ancillary data associated with the inner data block of that pixel data word.

The provision of a 12-bit wide video memory to store the 8-bit pixel data words means that a wider data bus and additional buffering and associated components are required. This adds to the complexity and physical size of the replay processing apparatus in a DVTR.

SUMMARY OF THE INVENTION

It is an object of the invention to provide an improved video memory.

This invention provides a video memory comprising: a video store for storing video data comprising a plurality of input video data blocks, each said input video data block comprising a plurality of pixel data words and one or more ancillary data words associated with said input video data block; a recirculating output buffer; means for reading said ancillary data words associated with a predetermined sequence of input video data blocks from said video store into said recirculating output buffer; and serial reading means for reading successive output video data blocks from said video store, each output video data block comprising pixel data words from said predetermined sequence of said input video data blocks, said serial reading means and said recirculating output buffer being operable to output concurrently each pixel data word in each output video data block with said ancillary data word(s) associated with said input video data block of said pixel data word.

In a video memory according to the invention the ancillary data word(s) associated with each inner (input) video data block need to be stored only once, even though the video memory still provides for the output of the ancillary data word(s) with each pixel data word of each outer (output) data block. In this way, the video memory does not need to store data words comprising a greater number of bits than the pixel data words alone.

Preferably each input video data block comprises pixel data words generated from a single video field, and the ancillary data word(s) associated with each input video data block comprises a field identifier indicative of the video field from which the pixel data words in that input video data block were generated.

Preferably, to ensure that the pixel data words and the associated ancillary data words are output concurrently, the serial reading means and the recirculating output buffer operate under the control of a common read clocking signal.

In a preferred embodiment, for ease of reading, the ancillary data words are stored at the same position within each input video data block; this is achieved by employing means for concatenating the ancillary data word(s) associated with each input video data block with the pixel data words from that input video data block, for storage in the video memory.

In order to facilitate subsequent error correction and concealment processing applied to the output video data blocks, it is preferred that the ancillary data word(s) associated with each input video data block comprises an error flag indicative of any data errors in that input video data block.

It is preferred that the video memory comprises means for re-writing at least a part of the ancillary data words in a modified form from the recirculating buffer into the video store. In particular a preferred embodiment, in which the ancillary data words do comprise error flags, comprises means for copying the error flag in the ancillary data word(s) associated with each input video data block to a re-read error flag in the ancillary data word(s) associated with that input video data block, and for setting the error flag in the ancillary data word(s) associated with that input video data block to an error-indicating state. In this embodiment the error flag is set to an error-indicating state after an input video data block has been read once, on the basis that in a normal operation mode that input video data block should not be required to be read again. However, it is envisaged that in some operational modes of the video memory (for example, during slow-motion replay of a DVTR incorporating the video memory), an input video data block may be required to be read more than once. The re-read error flag is used to preserve the error indication associated with an input video data block which has been read once, for use in subsequent read operations on that input video data block. Subsequently, if the write process fails to write any inner block to the memory, that failure can be detected on the next read cycle of the store. In this way, it is possible to detect areas of memory which have not been written to, as may occur during off-tape replay errors and particularly during shuttle replay.

Viewed from a second aspect this invention provides a digital video replay apparatus comprising: means for replaying video data from a storage medium, said video data comprising a plurality of input video data blocks, each said input video data block comprising a plurality of pixel data words and one or more ancillary data words associated with said input video data block; a video store for storing said input video data blocks;,a recirculating output buffer; means for reading said ancillary data words associated with a predetermined sequence of input video data blocks from said video store into said recirculating output buffer and serial reading means for reading successive output video data blocks from said video store, each output video data block comprising pixel data words from said predetermined sequence of said input video data blocks, said serial reading means and said recirculating output buffer being operable to output concurrently each pixel data word in each output video data block with said ancillary data word(s) associated with said input video data block of said pixel data word.

Viewed from a third aspect this invention provides a method of reading video data stored in a video store, said stored video data comprising a plurality of input video data blocks, each input video data block comprising a plurality of pixel data words and one or more ancillary data words associated with said input video data block, said method comprising the steps of: reading said ancillary data words associated with a predetermined sequence of input video data blocks into a recirculating output buffer; and serially reading pixel data words from said predetermined sequence of the input video data blocks to form successive output video data blocks, in synchronism with an output by said recirculating output buffer of the ancillary data word(s) associated with said input video data blocks of those pixel data words.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
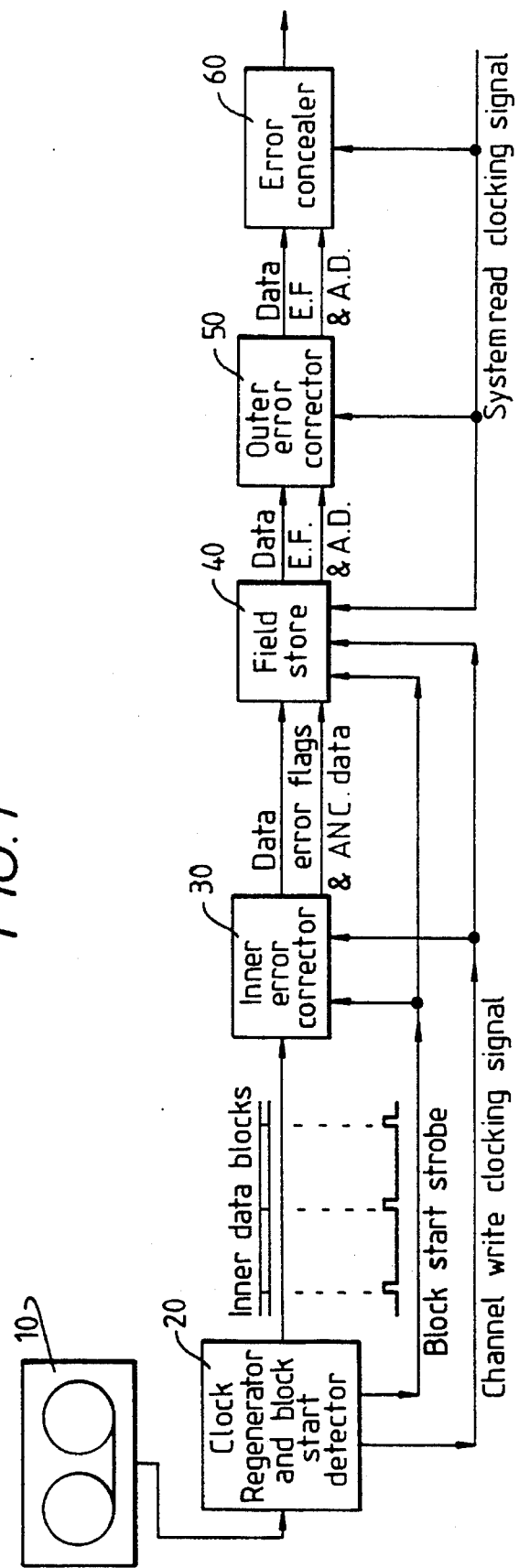
FIG. 1 is a schematic diagram showing the initial replay processing stages in a digital video tape recorder.

Referring now to FIG. 1, a schematic block diagram of the initial replay processing stages in a digital video tape recorder (DVTR) is shown, Video data are recovered from oblique tracks on a magnetic video tape by a tape transport 10 including one or more rotary helical scan magnetic replay heads. The replayed video data comprise a plurality of successive fixed-length 'inner' data blocks and are supplied first to a clock regenerator and block start detector 20. In the clock regenerator and block start detector 20 a channel write clocking signal is regenerated from the replayed data (to provide a clocking pulse corresponding to each data word of the replayed data) and the replayed data are examined to detect synchronisation information indicative of the start of each of the inner data blocks. The clock regenerator and block start detector 20 then sequentially outputs the replayed data along with a block start strobe signal which comprises a series of strobe or clocking pulses to mark the start of each inner data block.

The replayed data are passed from the clock regenerator and block start detector 20 to an inner error corrector 30. The inner error corrector 30 operates on individual inner data blocks and, using an error correction code included in the inner data block, attempts to correct any replay errors in that inner data block. The inner error corrector 30 is capable of using the error correction code to correct data errors of up to a certain severity, and to detect other data errors which are beyond its correction capabilities. Any errors which are detected but uncorrected are signified by an error flag associated with the data block which is output by the inner error corrector 30.

The corrected inner data blocks and the error flags are passed to a field store 40 in which they are stored under the control of the block start strobe signal. Such corrected inner data blocks reset the store's error flag status. Uncorrected inner blocks are not stored in the field store and do not attempt to reset the store's error flag status. The replayed data and the error flags are read out from the field store 40 for a further stage of error correction by an outer error corrector 50. Any remaining data errors which cannot be corrected by the outer error corrector 50 are then concealed by an error concealer 60. The corrected and concealed replayed data are then passed for further replay processing in the DVTR.

The channel write clocking signal is supplied from the clock regenerator and block start detector 20 to the inner error corrector 30 and to the field store 40. The field store 40, the outer error corrector 50 and the error concealer 60 receive a system read clocking signal providing a clocking pulse for each data word read out from the field store 40 and subsequently processed.

As described above, error correction in the replay processing circuits of the DVTR is split into two stages. The first stage (inner error correction) performs correction of short duration errors in the replayed data (particularly errors induced by random noise) and detection of all other errors in the replayed data. The second stage (outer error correction) operates on 'outer data blocks' comprising data from an area on the magnetic tape much larger than a single inner data block, and is arranged to perform error correction of long duration burst errors such as burst errors due to dropouts on the tape. The field store 40 is used to buffer and collate the replayed data, comprising successive inner data blocks, so that outer data blocks can be read for outer error correction processing.

Figure 2:
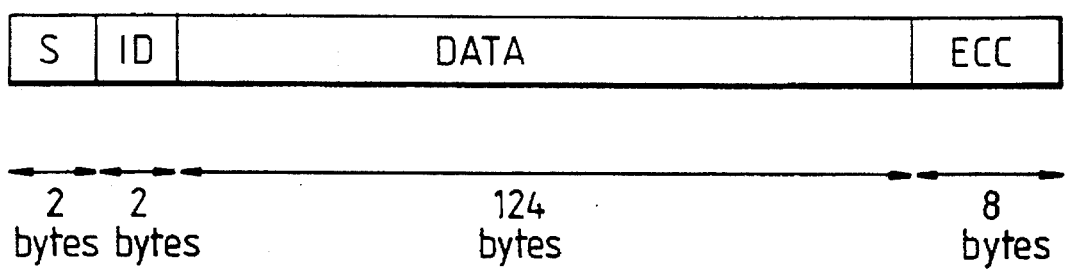
FIG. 2 is a schematic diagram showing the structure of an inner data block.

FIG. 2 is a schematic diagram showing the structure of an inner data block. Each inner data block comprises 2 bytes of synchronisation information ('S'), 2 bytes of channel identification information ('ID'), 124 bytes of video data ('DATA'), and 8 bytes of an error correcting code ('ECC'). The error correcting code portion is redundant following error correction by the inner error corrector 30, and the synchronisation information is no longer required after the inner data block has been processed by the clock regenerator and block start detector 20. This then leaves 124 bytes of video data and 2 bytes of channel identification information (a total of 126 bytes) to be stored in the field store 40.

Figure 3:
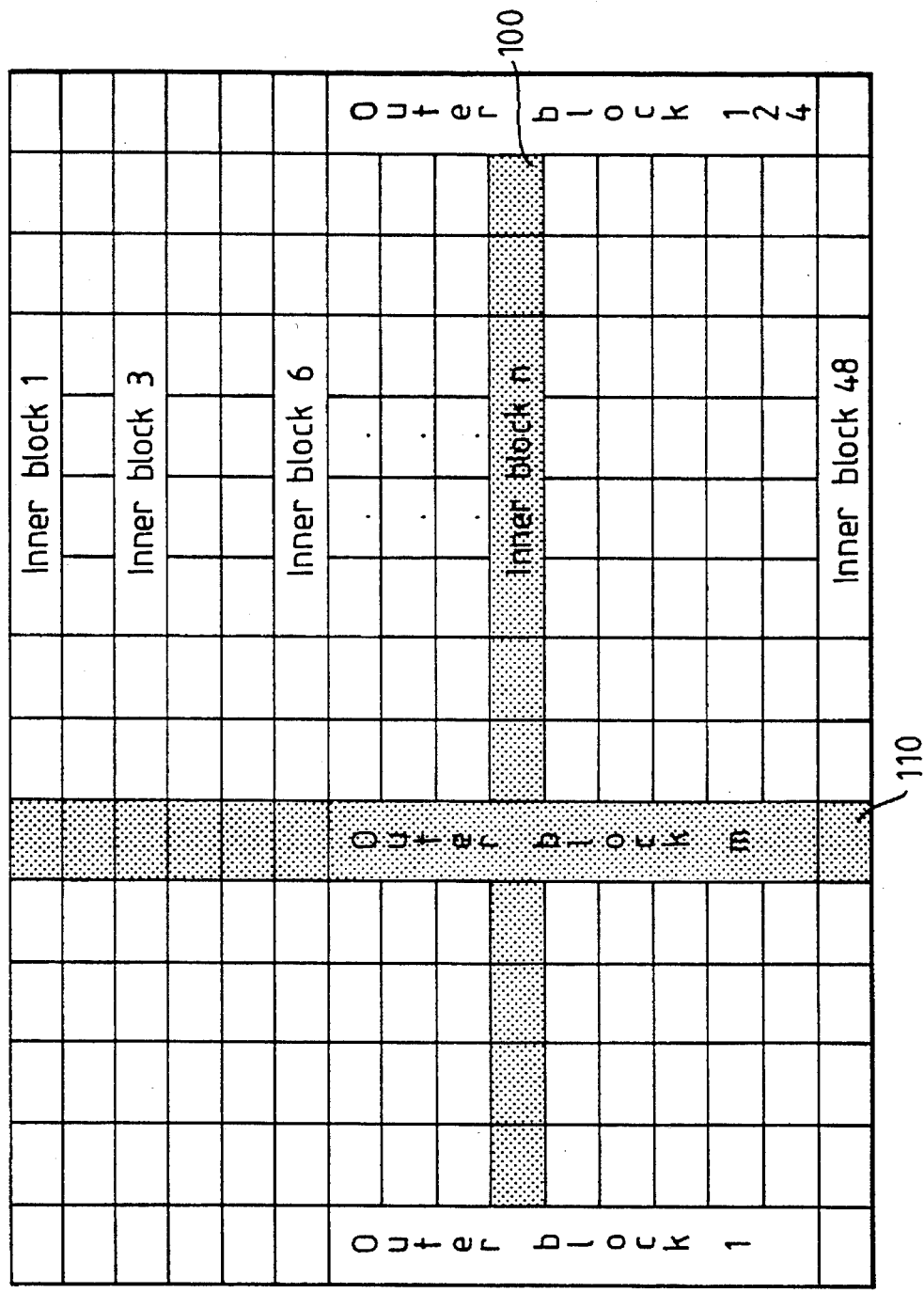
FIG. 3 shows the basic format in which inner data blocks are written to, and outer data blocks are read from, a replay field store.

FIG. 3 shows the basic format in which inner data blocks are written to, and outer data blocks are read from, the field store 40. The field store 40 is used to collate the replayed data into a so-called 'product block' of 124×48 bytes of data. The product block can be considered as a number of rows in an array of data, each row being a single inner data block after being processed by the inner error corrector 30, or as a number of columns of the array of data, each column forming a single outer data block (48 bytes). Inner error correction is applied (before the data are stored in the field store 40) to individual rows of the product block, and outer error correction is applied to individual columns of the product block. Because data are replayed from the tape sequentially as successive inner data blocks, a number of inner data blocks have to be stored in the field store in order to assemble the product block. Once the product block has been assembled, outer error correction can be performed by reading the stored data from the field store in a transposed order. For example, in the schematic illustration of FIG. 3 the inner data blocks are stored as horizontal rows of the field store and the outer data blocks are read as vertical columns of the field store. In order to illustrate this, a single inner data block 100 and a single outer data block 110 are shown as a shaded row and column respectively.

Figure 4:
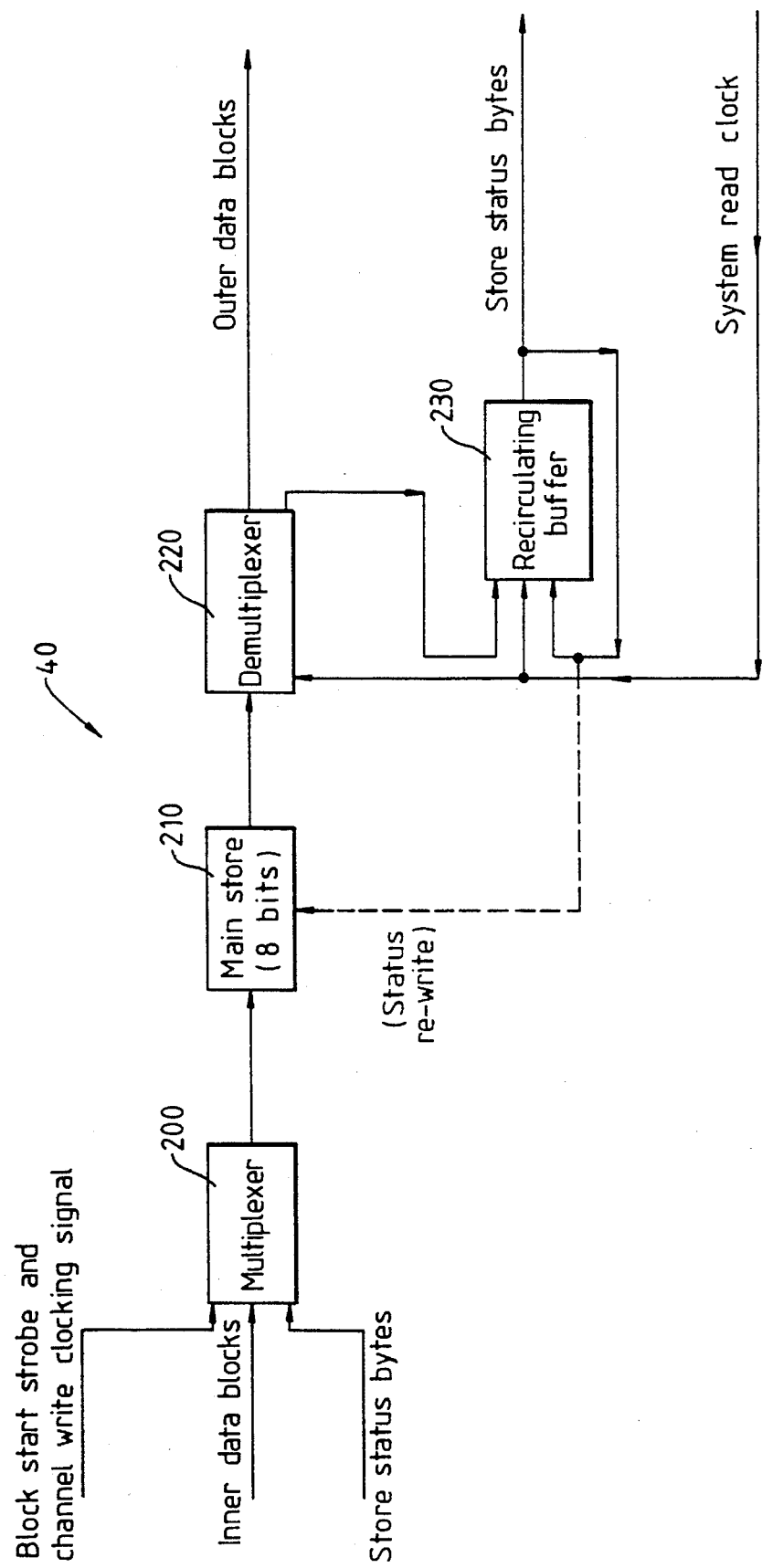
FIG. 4 is a schematic diagram of a field store.

FIG. 4 is a more detailed schematic diagram of the field store 40. A multiplexer 200 receives successive inner data blocks from the output of the inner error corrector 30, along with the error flag and other ancillary data associated with the inner data blocks. The inner data blocks, error flags and ancillary data are multiplexed by the multiplexer 200 for storage in a main store 210 which stores the data as an array of 8 bit data words. Data stored in the main store 210 are read out by a demultiplexer 220 which supplies outer data blocks for subsequent error correction by the outer error corrector 50, and supplies all of the error flags and ancillary data associated with the inner data blocks stored in the main store 210 to a recirculating buffer 230.

The multiplexer 200 operates under the control of the block start strobe signal and the channel write clocking signal, both generated by the clock regenerator and block start detector 20. The demultiplexer 220 and the recirculating buffer 230 are controlled by the system read clocking signal.

Figure 5:
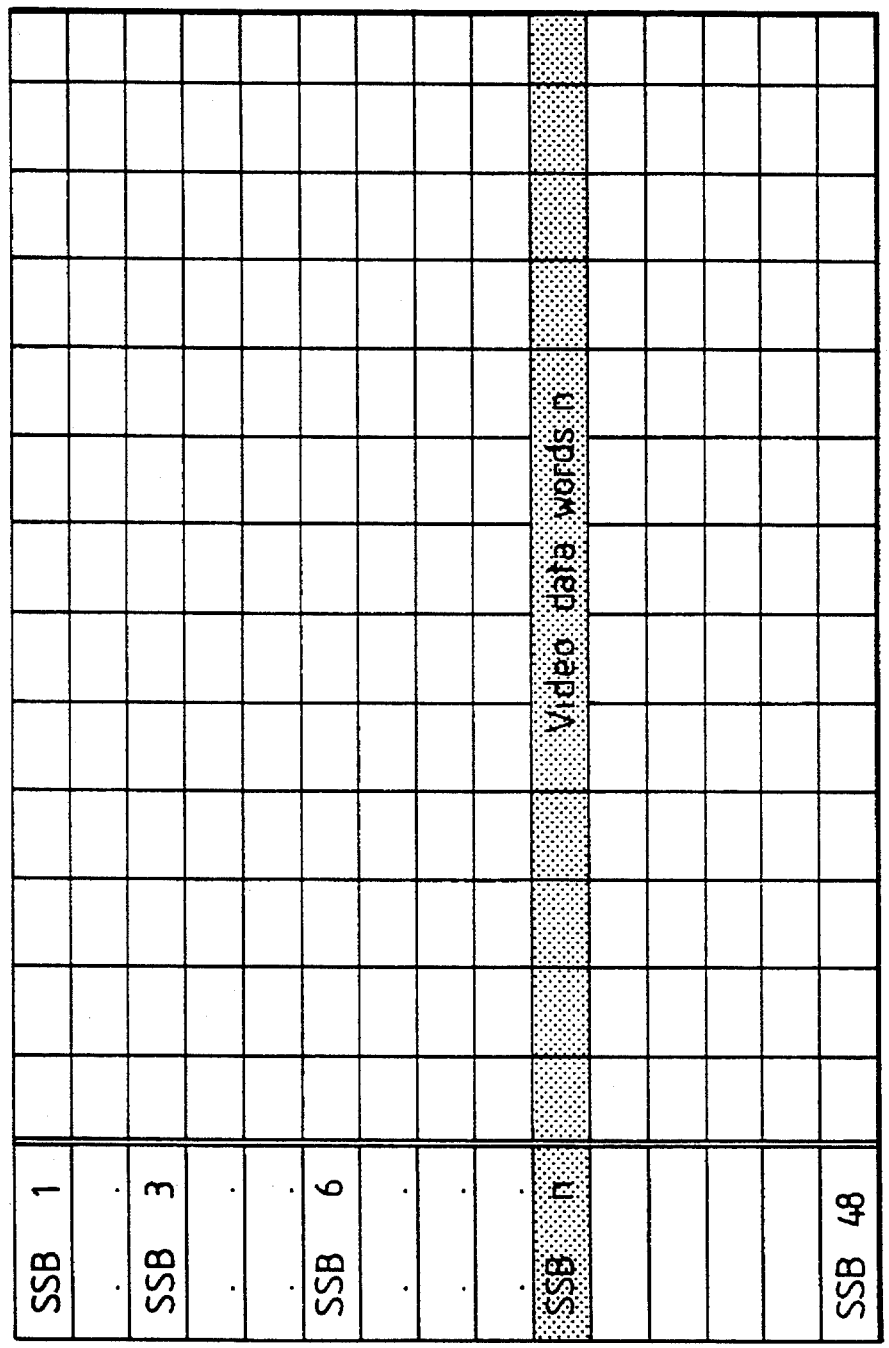
FIG. 5 shows the format of data storage in the field store of FIG. 4.

The operation of the field store of FIG. 4 will now be explained with reference to FIG. 5 which shows in more detail the format of data storage in the field store. Each inner data block received by the multiplexer 200 is concatenated with a store status data byte (to be described below) which includes the error flag associated with that inner data block along with other ancillary data for that inner data block. The result of this concatenation is stored as a single row in the main store 210. For example, in FIG. 5, one of the rows of data is shaded; this shaded row comprises a store status byte associated with an inner data block n, followed by (i.e. concatenated with) the pixel data words from the inner data block n. Thus, the store status byte is stored only once for each inner data block, in contrast with the previously proposed DVTR described above in which the error flag and ancillary data are separately appended to each of the pixel data words.

As described above, each inner data block (with the synchronisation information and the error correcting code having been removed) comprises 126 bytes of data. The main store 210 employs a 7 bit address to specify a particular column, which gives a total number of addressable columns of 128. Thus, there are two vacant addressable columns, one of which is used to hold the store status byte.

The demultiplexer 220 reads the main store 210 on a column-by-column basis. The first column of the main store read by the demultiplexer 220 comprises the store status bytes for all of the inner data blocks stored in the main store 210. This column of data is read by the demultiplexer 220 and passed to the recirculating buffer 230. The first column of data is then accessed with the same status byte address, but the main store is changed to a 'write' mode. During this write access the error flag in the recirculating buffer 230 is written into the re-read error flag position in the store status byte in each row of the main store, and the error flag in each row is set to an error state. The following columns of data are then read out serially, one column at a time. This means that as each column is read by the demultiplexer 220, a sequence of individual data words from each of the inner data blocks (rows) in the main store are read out.

In synchronism with the reading of each column by the demultiplexer 220, the recirculating buffer 230 outputs a sequence of the store status bytes in the same sequence as the pixel data words from the inner data blocks. This means that as each pixel data word is read from one of the columns (outer data blocks) of the main store, the store Status byte associated with the inner data block from which that pixel data word originated is also output by the recirculating buffer. Thus, although the store status bytes are stored only once in the main store 210, they are output by the field store 40 each time a pixel data word from the corresponding inner data block is output.

Figure 6:
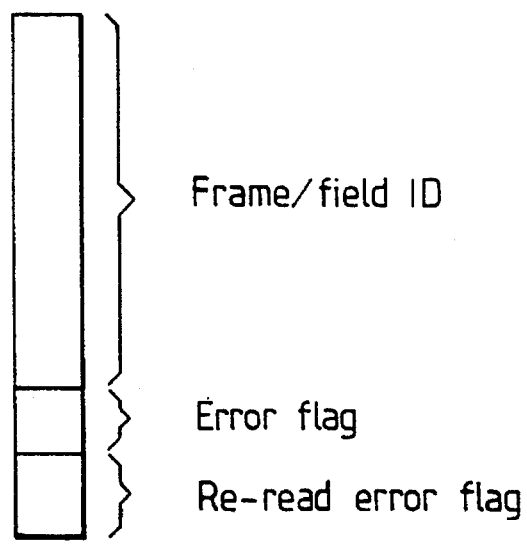
FIG. 6 is a schematic diagram showing the structure of a store status data word.

FIG. 6 is a schematic diagram showing the structure of a store status data byte. The store status data byte comprises the error flag associated with the corresponding inner data block, a re-read error flag (to be described below) and a frame or field identification portion indicating the video frame or field (in, for example, an eight-field repetitive sequence) from which the inner data block originated.

The re-read error flag is used by the outer error corrector 50 and the error concealer 60 during slow-motion replay by the DVTR. During slow-motion replay, video fields are read from the tape at a slower rate than the output field rate of the DVTR. This means that the video data stored in the field store may be read from the field store for output in for two or more consecutive output fields of the DVTR. In normal replay, video data which has been read once from the field store is treated as erroneous on subsequent read operations, since, at the time of the next read operation, that data should have been replaced by newly replayed video data. This is achieved by setting the error flag associated with the data to '1' (i.e. an error state) after the data has been read once. However, during slow-motion replay it is appropriate that the data should be read more than once and so a second error flag, the re-read error flag, is employed. Before the store status bytes are next read into the recirculating buffer, the error flag in the store status byte associated with that inner data block is copied to the re-read error flag, and then the error flag itself is set to '1' (error). During slow-motion replay, the outer error corrector 50 and the error concealer 60 refer to the re-read error flag for use in outer error correction and error concealment operations.

Figure 7:
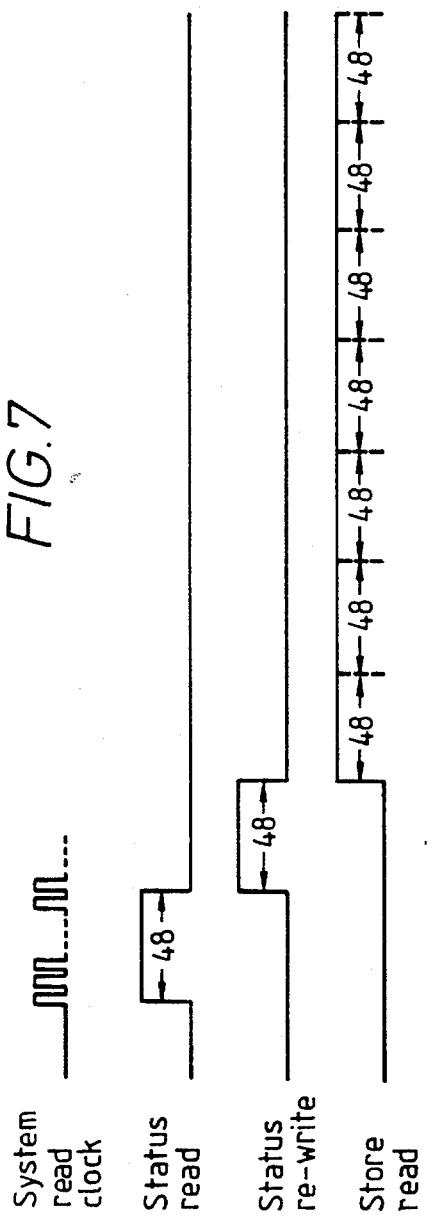
FIG. 7 is a timing diagram showing the operation of the video store and the recirculating buffer.

FIG. 7 is a timing diagram showing the operation of the main store and the recirculating buffer. The operation is divided into three phases: a status read cycle, a status re-write cycle and a number of store read cycles.

The status read cycle is performed first and involves the reading of the store status bytes into the recirculating buffer. This cycle is performed under the control of 48 clocking pulses of the system read clock. The error flags are then re-written to the re-read error flag positions in the field store, and the error flags in the field store set to an error state, during the status re-write cycle. Again, the status re-write cycle is performed under the control of 48 clocking pulses of the system read clock. Finally, 124 store read cycles are performed, each under the control of 48 clocking pulses of the system read clock. During each store read cycle an outer data block is output, along with the store status bytes in the recirculating buffer.

All of the status bytes are read out during the status read cycle and then all of the modified status bytes are re-written during the status re-write cycle. There is therefore no need to perform individual read-modify-write operations (which would require faster and more stringently timed clocking signals) on the main store.

The status re-write cycle is shown occurring immediately after the status read cycle. However, the only condition on the timing of the status re-write cycle is that it should occur before the next status read cycle takes place. For example, the status re-write cycle could be performed after all of the data from an inner data block has been read once (this situation would be known from the store sequence timing logic).

To summarise the operation of the re-read error flag, during the first read operation performed on inner data blocks stored in the field store, the error flag and re-read error flag are output as follows:

|  | Inner Data Block Number | | | | |
| --- | --- | --- | --- | --- | --- |
|  | 1 | 2 | 3 | ... | n |
| Error Flag | EF(1) | EF(2) | EF(3) | ... | EF(n) |
| Re-Read Error Flag | 0 | 0 | 0 | ... | 0 | and during the second and subsequent read operations the error flag and the re-read error flag are output as follows:

|  | Inner Data Block Number | | | | |
| --- | --- | --- | --- | --- | --- |
|  | 1 | 2 | 3 | ... | n |
| Error Flag | 1 | 1 | 1 | ... | 1 |
| Re-Read Error Flag | EF(1) | EF(2) | EF(3) | ... | EF(n) |

Figure 8:
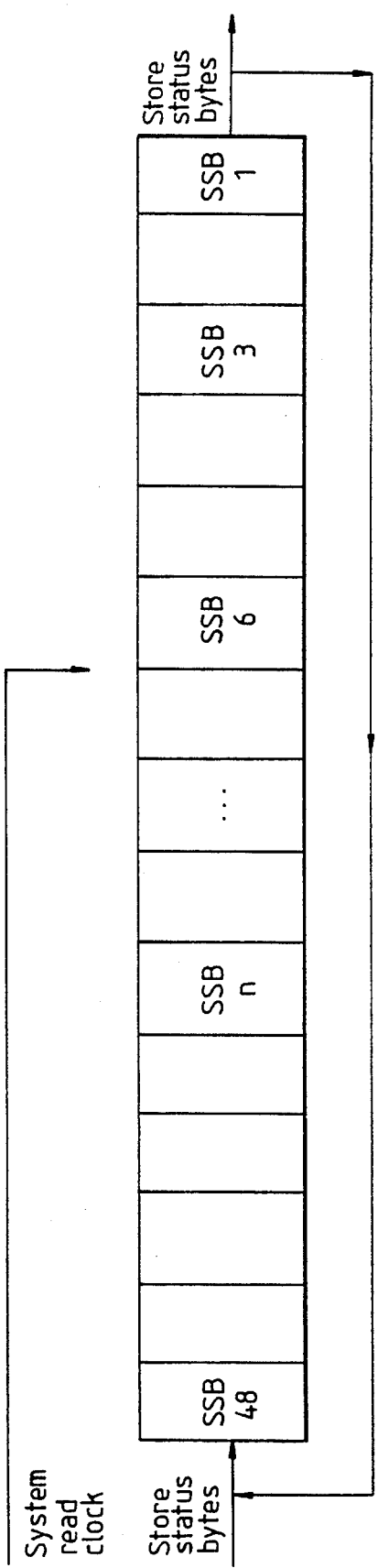
FIG. 8 is a schematic diagram of a recirculating buffer.

FIG. 8 is a schematic diagram of the recirculating buffer 230. The recirculating buffer 230 is a first-in-first-out (FIFO) buffer which is clocked by the system read clocking signal and which receives a serial data input comprising the store status bytes from the first column of the main store 210 in FIG. 4. In other words, the store status byte for the inner data block 1 is read out first, followed by the store status byte for the inner data block 2, and so on. As each store status byte is output by the recirculating buffer 230 (under the control of the system read clocking signal) that store status byte is fed back to the input of the recirculating buffer 230 and the remaining stored store status bytes advance by one position towards the output of the recirculating buffer.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A video memory comprising:

a video store for storing video data comprising a plurality of input video data blocks, each of said input video data blocks comprising a plurality of pixel data words and at least one ancillary data word associated with the input video data block for identifying at least one video field represented by said plurality of pixel data words;

a recirculating output buffer having a storage capacity equal to the number of ancillary data words associated with each said input video data block times the number of said input video data blocks stored in said video store, said recirculating output buffer for storing data words, reading out the stored data words and re-storing the read out data words;

means for reading the ancillary data words associated with a predetermined sequence of said input video data blocks from said video store into said recirculating output buffer in response to a read control signal; and serial reading means for reading successive output video data blocks from said video store in response to said read control signal, each output video data block comprising pixel data words from said predetermined sequence of said input video data blocks, said serial reading means and said recirculating output buffer being operable in response to said read control signal to output concurrently each pixel data word in each output video data block with said at least one ancillary data word associated with said input video data block of the pixel data word being output.

2. A video memory according to claim 1, in which each said input video data block comprises pixel data words representing a single video field.

3. A video memory according to claim 1, comprising means for concatenating said at least one ancillary data word associated with each input video data block with said pixel data words from said input video data block, for storage in said video memory.

4. A video memory according to claim 1, in which said at least one ancillary data word associated with each input video data block comprises an error flag indicative of a data error in said input video data block.

5. A video memory according to claim 4, further comprising means for rewriting at least a part of said at least one ancillary data word in a modified form from said recirculating buffer into said video store.

6. A video memory according to claim 5, in which said at least one ancillary data word also includes a re-read error flag for indicating whether a repeatedly read one of said input video data blocks contains an error, and further comprising means for copying said error flag in said at least one ancillary data word associated with each said input video data block to said re-read error flag in the at least one ancillary data word, and for setting said error flag in the at least one ancillary data word to an error-indicating state after the associated input video data block is read once.

7. A video memory according to claim 1, wherein exactly one of said ancillary data words is associated with each said input video data block and wherein said recirculating output buffer has a storage capacity equal to one byte times the number of said input video data blocks stored in said video store.

8. Digital video replay apparatus comprising:

means for replaying video data from a storage medium, said video data comprising a plurality of input video data blocks, each of said input video data blocks comprising a plurality of pixel data words and at least one ancillary data word associated with the input video data block for identifying at least one video field represented by said plurality of pixel data words;

a video store for storing said input video data blocks;

a recirculating output buffer having a storage capacity equal to the number of ancillary data words associated with each said input video data block times the number of said input video data blocks stored in said video store, said recirculating output buffer for storing data words, reading out the stored data words and re-storing the read out data words;

means for reading the ancillary data words associated with a predetermined sequence of said input video data blocks from said video store into said recirculating output buffer in response to a read control signal; and serial reading means for reading successive output video data blocks from said video store in response to said read control signal, each output video data block comprising pixel data words from said predetermined sequence of said input video data blocks, said serial reading means and said recirculating output buffer being operable in response to said read control signal to output concurrently each pixel data word in each output video data block with said at least one ancillary data word associated with said input video data block of the pixel data word being output.

9. A method of reading video data stored in a video store, said stored video data comprising a plurality of input video data blocks, each of said input video data blocks comprising a plurality of pixel data words and at least one ancillary data word associated with the input video data block for identifying at least one video field represented by said plurality of pixel data words, said method comprising the steps of:

reading the ancillary data words associated with a predetermined sequence of said input video data blocks from said video store into a recirculating output buffer having a storage capacity equal to the number of ancillary data words associated with each said input video data block times the number of said input video data blocks stored in said video store;

reading the stored ancillary data words from said recirculating output buffer in response to a control signal;

re-reading the read out ancillary data words into said recirculating output buffer; and serially reading pixel data words from said predetermined sequence of said input video data blocks in response to said control signal to form successive output video data blocks in synchronism with the reading of the stored at least one ancillary data word associated with the input video data block of the pixel data word being serially read.

\* \* \* \* \*